United States Patent [19]
Greco et al.

[11] Patent Number: 6,121,129
[45] Date of Patent: Sep. 19, 2000

[54] METHOD OF CONTACT STRUCTURE FORMATION

[75] Inventors: Nancy Anne Greco; Stephen Edward Greco, both of LaGrangeville; Tina Jane Wagner, Newburgh, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/784,158

[22] Filed: Jan. 15, 1997

[51] Int. Cl.$^7$ .................................. H01L 21/4763
[52] U.S. Cl. ................ 438/622; 438/624; 438/638; 438/672
[58] Field of Search ........................ 438/622, 623, 438/624, 637, 638, 672; 257/758, 759, 760

[56] References Cited

U.S. PATENT DOCUMENTS

| | | | |
|---|---|---|---|
| 4,855,252 | 8/1989 | Peterman et al. | 437/189 |
| 5,100,812 | 3/1992 | Yamada et al. | 438/365 |
| 5,126,006 | 6/1992 | Cronin et al. | 156/643 |
| 5,189,506 | 2/1993 | Cronin et al. | 257/752 |
| 5,210,053 | 5/1993 | Yamagata . | |
| 5,266,446 | 11/1993 | Chang et al. | 430/314 |
| 5,275,963 | 1/1994 | Cederbaum et al. | 438/624 |
| 5,354,712 | 10/1994 | Ho et al. | 437/195 |
| 5,424,154 | 6/1995 | Borodovsky | 430/5 |
| 5,472,814 | 12/1995 | Lin | 430/5 |
| 5,479,054 | 12/1995 | Tottori | 257/752 |
| 5,563,012 | 10/1996 | Neisser | 430/22 |
| 5,760,429 | 6/1998 | Yano et al. | 257/711 |
| 5,792,703 | 8/1998 | Bronner et al. | 438/620 |

FOREIGN PATENT DOCUMENTS

| | | |
|---|---|---|
| 0469214A1 | 5/1992 | European Pat. Off. . |
| 60-167328 | 8/1985 | Japan . |

OTHER PUBLICATIONS

F. White, ert al. "Damascene Stud Local Interconnect in CMOS Technology", IEEE IEDM Tech. Digest, Apr. 1992, pp. 301–303.

T. Tang, et al. "Titanium Nitride Local Interconnect Technology for VLSI", IEEE Transactions on Electron Devices, vol. ED–34, No. 3, Mar. 1987; pp. 682–687.

W. Lynch, "Self–Aligned Contact Schemes for Source–Drains in Submicron Devices", IEEE IEDM Tech. Digest, Dec. 1987, pp. 354–357.

R. D. J. Verhaar, et al. "A 25 um2 Bulk Full CMOS Stram Cell Technology with Fully Overlapping Contacts", IEEE IEDM Tech. Dig., Dec. 1990, pp. 473–476.

IBM Technical Disclosure Bulletin; vol. 24 No. 11B Apr., 1982 "Contact Via Etch Masks for Double–Polysilicon Process" by A. S. Bergendahl, pp. 5903–5904.

EPO Search Report dated Jan. 12, 1998, 97310318.7–2203.

*Primary Examiner*—T. N. Quach
*Attorney, Agent, or Firm*—Joseph P. Abate; Susan M. Murray

[57] ABSTRACT

A method of forming a semiconductor structure having features of differing sizes, includes forming a first layer on a semiconductor substrate; patterning only a first plurality of features of a first feature size on the first layer; removing portions of the first layer, the portions corresponding to the first plurality of features, filling the first plurality of openings; forming a second layer, the second layer overlying the first layer and the filled openings; patterning a second plurality of features of a second feature size on the second layer; removing portions of the first layer and second layer, the portions corresponding to the second plurality of features, the second plurality of openings extending through the first and second layers, and filling the second plurality openings.

11 Claims, 11 Drawing Sheets

METHOD OF CONTACT STRUCTURE FORMATION

FIELD OF THE INVENTION

This invention relates to the manufacture of electronic devices and, specifically, to the optimal resolution of features formed by large and small optical signals with particular application to the manufacture of semiconductor devices, but not limited thereto.

BACKGROUND OF THE INVENTION

The implementation of a semiconductor manufacturing process may form a structure, shown in FIG. 1, that comprises three distinct, principal structures: the device structure 1, the contact structure 2 and the wiring structure 3. The device structure 1 generally includes a semiconductor substrate 4 and transistors 8 on the semiconductor 4 surface 4a. The wiring structure 3 generally includes one or more levels of wiring metal 5 separated by one or more passivation layers 6. The wiring structure 3 typically includes horizontal conducting paths 7 (hereinafter referred to as lines) through which transistors and passive elements can be interconnected. The contact structure 2 is generally located between the device structure 1 and the wiring structure 3. The boundaries between the contact structure 2 and the device 1 and wiring 3 structures are respectively indicated by dashed lines A and B in FIGS. 1 and 2. The contact structure 2 includes an insulating region 12 that contains vertical conducting paths generally indicated by reference numeral 9 (hereinafter referred to as studs) that connect lines 7 within the wiring structure 3 (hereinafter referred to as wiring lines or wiring metal) to the device structure 1.

It is known in the art that implementing a "Local Interconnect" (LI) scheme can improve the density and performance of semiconductor integrated circuits. As used herein, LI may be defined as the interconnection of proximately located transistors or other semiconductor devices with lines that are located beneath the wiring structure 3. An example of a LI structure is line 10 in FIG. 1. If LI is not utilized, all interconnections between transistors (or other semiconductor devices), including proximately located transistors, must be formed by studs 9 within the contact structure 2 and wiring lines 7 located within the wiring structure 3. As compared to a scheme that does not utilize Local Interconnect, a scheme with interconnections beneath the first layer of wiring metal 5 can reduce (but does not necessarily eliminate) the need for studs 9 and the wiring lines 7. Because studs 9 consume surface area, reducing the need for studs 9 results in semiconductor devices with improved packing density. Furthermore, some local interconnection lines 10 have a smaller width than wiring lines 7, resulting in a further improvement of the semiconductor device's packing density. Lastly, because the path length of a local interconnection 10 is usually not as long as the path length of an interconnection that extends through the wiring metal 7, utilizing LI results in interconnections with inherently smaller series resistance, shunt capacitance and series inductance. As a result, transient performance is improved. Thus motivations for LI are the increase in packing density and the decrease in propagation delay.

FIG. 2 is a more detailed schematic of a contact structure 22 sandwiched between a device structure 11 and a wiring structure 33 that implements an LI scheme. Different LI schemes may have different levels of complexity. For example, many LI schemes have only one level of interconnection that is limited to one or more strips, typically polysilicon, called LI lines 13, that are placed upon field isolation regions 121. Additional levels of interconnection may add complications to the process but may also add improvements to the packing density and transient performance beyond the improvements realized with the use of only LI lines 13. An additional level of local interconnection, referred to as an LI bar 14, may be placed not only upon the field isolation region 121 but also upon a gate electrode 15 or a source/drain diffusion region 16.

As is typical in the art, LI lines 13 are typically formed on top of the field isolation region 121 during the formation of the gate electrode 15 (assuming the semiconductor process is a field effect transistor (FET) process; otherwise LI lines 13 may be formed independently). As a result, LI lines 13 are typically the same material and thickness as the gate electrode 15. LI lines 13 normally run along the surface of the field isolation region 121, and thus lines 13 do not normally directly contact the source/drain diffusion regions 16. Rather, an LI line 13 requires a separate structure to electrically connect an LI line 13 to a source/drain diffusion region 16. The electrical connection between the LI line 13 and the source/drain diffusion region 16 is typically formed by either of two techniques: 1) a thin film, usually metal, referred to as a "strap" (not shown), that bridges from the LI line 13, across the field isolation region 121, to a diffusion region 16; or 2) a bar-like structure 17 that bridges across the field oxide 121 (similar to a strap) in order to electrically connect the source/drain diffusion region 16 and LI line 13. The structures of FIGS. 1–4 show the utilization of the second technique; however, it should be understood that the subsequently described invention applies to either.

Because LI bars 14 may be placed directly upon transistor terminals (gate 15, source/drain diffusion regions 16), LI bars 14 may directly connect proximately located transistors (or other semiconductor devices). LI bars are usually formed during the formation of partial stud structure 99a. Under prior art methods, stud structures are typically the combination of partial stud structures 99a and 99b. Partial stud structures 99a and 99b are usually formed in two separate series of steps. That is, partial stud structure 99a is formed first, followed by the formation of partial stud structure 99b. This is known in the art as a "stacked" stud structure because partial stud structures 99b are stacked upon partial stud structures 99a. Because LI bars 14 are typically formed during the formation of partial stud structures 99a, LI bars 14 are normally the same material and thickness as partial stud structures 99a. Typically, the material used for partial stud structures 99a and 99b is a metal, such as tungsten. Because LI bars 14 are the same thickness as partial stud structures 99a, a second layer of insulation 18 is required (above a first layer of insulation 20) between the top of the partial stud structures 99a and LI bars 14 and the bottom of the first level wiring metal 55. This second layer of insulation 18 prevents the LI bars 14 from shorting to the first level metal 55 of the wiring structure 33. Partial stud structures 99b continue through this layer of insulation 18 to the first level metal 55. LI bars 14 are capable of interconnecting the terminals of a transistor to the terminals of other transistors.

As explained hereinabove, the gate electrode 15 is typically polysilicon and partial stud structures 99a and 99b are typically metal. Because LI lines 13 are usually formed during the formation of gate electrodes 15, LI lines 13 are typically polysilicon. Also, as explained above, because LI bars 14 are usually formed during the formation of partial stud structures 99a, LI bars 14 are typically metal. Hence, LI lines 13 have greater resistance per unit length than LI bars 14 as polysilicon generally has a higher resistivity than metal and the cross sectional area of an LI line 13 is smaller than an LI bar 14. Therefore, LI bars 14 are typically reserved for longer interconnections while LI lines 13 are reserved for shorter interconnections. However, an LI bar 19 may be placed directly upon an LI line 13 so that the resistivity of the interconnection is reduced. LI bars 14 may not only be placed on the field isolation region 121 but may also be placed directly upon a gate electrode 15 or source/drain diffusion region 16. Particular electrical connections are selected as LI bars 14 or LI lines 13 based on an optimum layout that minimizes overall surface area consumption.

As previously discussed, utilizing local interconnects does not completely eliminate the need for conventional studs. That is, a process that utilizes LI typically requires the formation of partial stud structures 99a and 99b to connect the gate electrode 15 or source/drain diffusion regions 16 or passive elements (not shown) to the wiring structure 33. Furthermore, a process that utilizes LI typically requires the formation of studs (not shown) that connect LI bars 14 or LI lines 13 to the wiring structure 33. Thus, within the contact structure 22 there may exist: 1) conventional partial stud structures 99a and 99b, 2) studs (not shown) that connect the wiring structure 33 to LI bars 14 or LI lines 13, 3) LI bars 14, 4) bar-like structures 17 that connect source/drain diffusion regions 16 to LI lines 13, 5) bar-like structures (not shown) that directly connect a source/drain diffusion region 16 to a gate electrode of the same transistor. However, as any conceivable shape or sized structure may be formed during the formation of stud structures 99a and 99b, the above list is not all inclusive. Note that LI lines 13 (again, because they are usually formed simultaneously with the gate electrode 15) are within the device structure 11 not the contact structure 22.

In summary, FIG. 2 shows the contact structure 22 generally including two levels, a first lower level 21 and a second upper level 23. The first lower level 21 is formed first and primarily includes LI bars 14 and partial stud structures 99a within a layer of isolation 20. The second upper level 23 is formed after the first level and typically includes a layer of isolation 18 between the top 21a of first level 21 and the first layer of metal 55 in the wiring structure 33. The second level 23 includes partial stud structures 99b that simply "continue" the partial stud structures 99a formed in the first level 21.

FIGS. 3A–F show a conventional processing method utilized to form a contact structure that is similar, but not identical, to the contact structure 22 of FIG. 2.

FIG. 3A shows an exemplary completed device structure 27 that includes: completed transistors 24 and 25 formed on semiconductor substrate 82, completed field isolation regions 26 an LI line 28, and gate electrodes 31 overlying their respective gate oxides. The particular methods of forming the structures referred to above are well-known and will not be discussed in detail herein.

FIG. 3B shows the structure formed by the initial steps of the prior art method of forming a contact structure. First, an etch stop layer 36, which may comprise, for example, silicon nitride, is formed over the surface of the device structure 27. Then, an insulating layer 37, such as phosphosilicate glass (hereinafter referred to as PSG), may be formed over the etch stop layer 36. The insulating layer 37 may be formed by known methods such as deposition, for example, chemical vapor deposition (CVD), plasma enhanced CVD (PECVD) or low pressure CVD (LPCVD).

FIG. 3C shows the structure formed after a first level mask exposure and subsequent etch. Once the structure of FIG. 3B is formed, a layer (not shown) of photosensitive material (e.g., photoresist) is formed over the surface 37a of the insulating layer 37. Then, optical patterns formed by light passing through the transparent regions of the first level mask are projected upon the photosensitive layer. Under the prior art method, the optical patterns produced by the first level mask comprise both LI bars (e.g. "bars") and studs (e.g. "holes"). Once the photosensitive layer is properly exposed it is developed. Developing involves immersing the photosensitive layer in a developing solution (e.g. "developer") which acts to dissolve either the respective exposed or unexposed regions depending upon whether the photosensitive layer is positive or negative, respectively.

Thus regions of insulating layer 37 are exposed where either studs or LI bars are desired. These regions are etched anisotropically, for example by a reactive ion etch (RIE), such that openings 52 are formed in insulating layer 37. Next, the hardened photosensitive material is removed and the exposed etch stop layer 36 is selectively removed in the areas of openings 52.

Under prior art methods, the mask for the first level 21 contains patterns that represent both LI bars 14 and studs as is apparent from the discussion of FIG. 2. Because LI lines 13 are normally formed simultaneously with the gate electrode 15, the patterns that represent LI lines 13 are normally located on the gate electrode 15 level mask not the first level 21 mask for the contact structure 22.

FIG. 3D shows the completed first level 48. After the structure of FIG. 3C has been formed, the openings 52 are conformally coated first by a liner layer 38 of material that promotes adhesion, such as titanium, then by a diffusion barrier layer 39, for example, titanium nitride. Finally, a conductive material 40 (preferably a metal such as tungsten) fills the coated openings 52. The conductive material 40 is then polished until the insulating region 37 is reached.

FIG. 3D shows: 1) the first section of a stacked wiring-metal-to-gate metal stud 41, 2) the first section of two stacked wiring-metal-to-diffusion-region studs 42, 3) a bar-like structure 43 formed to create an electrical connection between the LI line 28 and a diffusion region 32a of transistor 25, 4) an LI bar 44 placed upon a gate 31 and 5) an LI bar 45 located upon a diffusion region 32b. Other bar and stud structures are possible (e.g. a bar-like structure that bridges across the field oxide to connect adjacent diffusion regions). The differences between gate stud 41 and LI bar 44, and the differences between studs 42 and LI bar 45 are not readily apparent in the cross-section shown in FIG. 3C. The primary difference between them is that studs 41 and 42 are localized to relatively small hole or rectangular structures, while the LI bars 44 and 45 are elongated lines that deliberately extend in and out of the plane of the drawing. Thus, LI bars 44 and 45 are formed with relatively large optical signals and studs 41 and 42 are formed with relatively small optical signals.

FIG. 3E shows the contact structure after a second level insulating layer 46 has been formed, optically patterned and etched over the finished first level 48. First, an insulating layer 46, preferably of PSG, is formed over the finished first level 48. A layer of photosensitive material is formed over the insulating layer 46. Then, optical patterns produced by a second level mask and representing partial stud structures 99b to the first level wiring metal 55 (as shown in FIG. 2), are focused on the photosensitive material. The photosensitive layer is exposed and in a manner similar to that described above with respect to FIG. 3C, thus thus exposing regions of insulating layer 46 beneath which are structures previously formed in the first level 48. The exposed insulating layer 46 is removed, resulting in the formation of openings 49 in the insulating layer 46.

FIG. 3F shows the completed contact and device structures. Once the structure in FIG. 3E is formed, the openings 49 of the second level insulating layer 46 are first lined with appropriate adhesion and diffusion barrier layers as discussed with reference to FIG. 3C, and then filled with an appropriate conductive material 51, such as tungsten. Thus the contact structure, in this example, includes: 1) a fully formed stacked wiring-metal-to-gate-metal stud 52; 2) two fully formed stacked wiring-metal-to-diffusion region studs 53; 3) a bar-like structure 43 that forms an electrical connection between a diffusion region 32a and an LI line 28; 4) an LI bar 44 that runs along the gate 31; and 5) an LI bar 45 that runs along a diffusion region 32b that is also connected, at this cross section, to a wiring-metal-to-LI-bar stud 54.

Referring back to FIG. 2, the prior art mask set for the contact structure contains two masks: 1) a first level 21 mask that contains patterns for LI bars, studs and bar-like structures; and 2) a second level 23 mask that contains patterns for partial stud structures 99b.

Prior art first level 21 masks help produce optical patterns of different shapes and sizes, which may represent areas of metallization (or isolation depending on whether negative or positive photoresist is used). For example, first level 21 masks help produce small, round images for studs 99a, as well as wide, rectangular images for LI bars 14. Optical signals derived from an optical projection system are formed at the mask plane (e.g. object plane) by the passage of light through the mask. The light is subsequently collected and focused by a lens of a particular numerical aperture onto a photosensitive layer (e.g. image plane). The numerical aperture is a number less than one which indicates the collection lens' ability to collect all the diffracted light from the object plane. The focused images on the photosensitive layer can have different light intensities per unit area as a function of the differences in the sizes of the desired optical images. Generally, the smaller the feature size at the object plane, the less intensity per unit area exists at the image plane. Thus, utilizing the prior art first level mask results in a lithography problem. More particularly, patterns for studs 99a ("holes") have less optical intensity per unit area when focused on the photosensitive layer than patterns for LI bars 14 ("bars") because holes are smaller in size than bars. In general, bars can be several times larger than holes. More specifically, bars may be several microns or larger, while holes are typically fractions of a micron in state of the art technology. As a result, the optimum exposure time is different for the two kinds of features features.

The variation of intensity with pattern size can result in the unsatisfactory choices of: 1) printing bars to the desired accuracy while underexposing holes; 2) printing holes to the desired accuracy while overexposing bars or 3) compromising between the previous two options such that neither holes nor bars are printed to the desired accuracy but neither holes nor bars are underexposed or overexposed as severely as the previous two options. Previously this dilemma has been addressed by modifying the dimensions of the features in the first level 21 mask so as to compensate for the differences in printing. For example, bar features on the first level 21 mask were made to be more narrow than desired, but the overexposure from the necessary hole exposure resulted in an "overexposed" bar that had the desired dimensions after development of the photoresist. As dimensions decrease below 0.3 um, such compensation techniques are no longer workable.

Possible alternatives to solve the problem of accurately patterning features of different sizes are: 1) lowering the wavelength of the light (which decreases the distribution of diffracted light for a fixed feature size); or 2) increasing the optical bandwidth of the projection system. However, decreasing the wavelength requires more expensive production equipment, for example, X-ray lithography systems. The other alternative, increasing the optical bandwidth (by utilizing a collection lens with higher numerical aperature), has the disadvantage of decreasing the depth of focus of the image. A high depth of focus is desirable because it allows for a high tolerance in placement of the wafer relative to the focal plane of the lens. At dimensions under 0.3 um, increasing the numerical aperture of the lens in order to increase the optical signal intensity per unit area for small size features results in prohibitive narrowing of the depth of focus margin. Thus, cost effective semiconductor equipment that directly addresses the problem is not yet available.

What is needed is a method that utilizes existing production equipment and achieves full optical resolution of holes and bars without adding significant expense and complication to the process.

SUMMARY OF THE INVENTION

It is an object of the present invention to provide a fabrication method that overcomes the disadvantages described above when forming features of varying sizes.

The present invention is directed to a method of forming a semiconductor structure having features of differing sizes, the method including the steps: a) forming a first layer on a semiconductor substrate; b) patterning only a first plurality of features of a first feature size on the first layer; c) removing portions of the first layer, the portions corresponding to the first plurality of features, thus forming in the first layer a first plurality of openings corresponding to the first plurality of patterned features; d) filling the first plurality of openings; e) forming a second layer, the second layer overlying the first layer and the filled openings; f) patterning a second plurality of features of a second feature size on the second layer; g) removing portions of the first layer and second layer, the portions corresponding to the second plurality of features, thus forming in the second layer a second plurality of openings corresponding to the second plurality of patterned features, the second plurality of openings extending through the first and second layers; and h) filling the second plurality of openings.

In one preferred embodiment the method of the present invention is used to fabricate a contact structure having at least two dielectric layers. Only bars or bar-like structures, are formed in the first dielectric layer, and stud structures are formed after formation of the second dielectric layer. Thus only relatively large features are formed at one level and only relatively small features are formed at another level.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DETAILED DESCRIPTION OF THE PREFERRED EMBODIMENT

FIGS. 4A–F depict a semiconductor structure at various stages of completion of a preferred embodiment of the method of the present invention utilized to form a contact structure with two levels of local interconnect, that is LI bars and LI lines. It is noted that although the description of the invention refers specifically to a contact structure, the subject matter of the invention is applicable to other semiconductor structures as well. That is, the method of only forming relatively large features at one level and only forming relatively small features at another level, in order to improve overall lithography resolution of the semiconductor integrated circuit, could be utilized anywhere in the semiconductor process.

Figure 1:
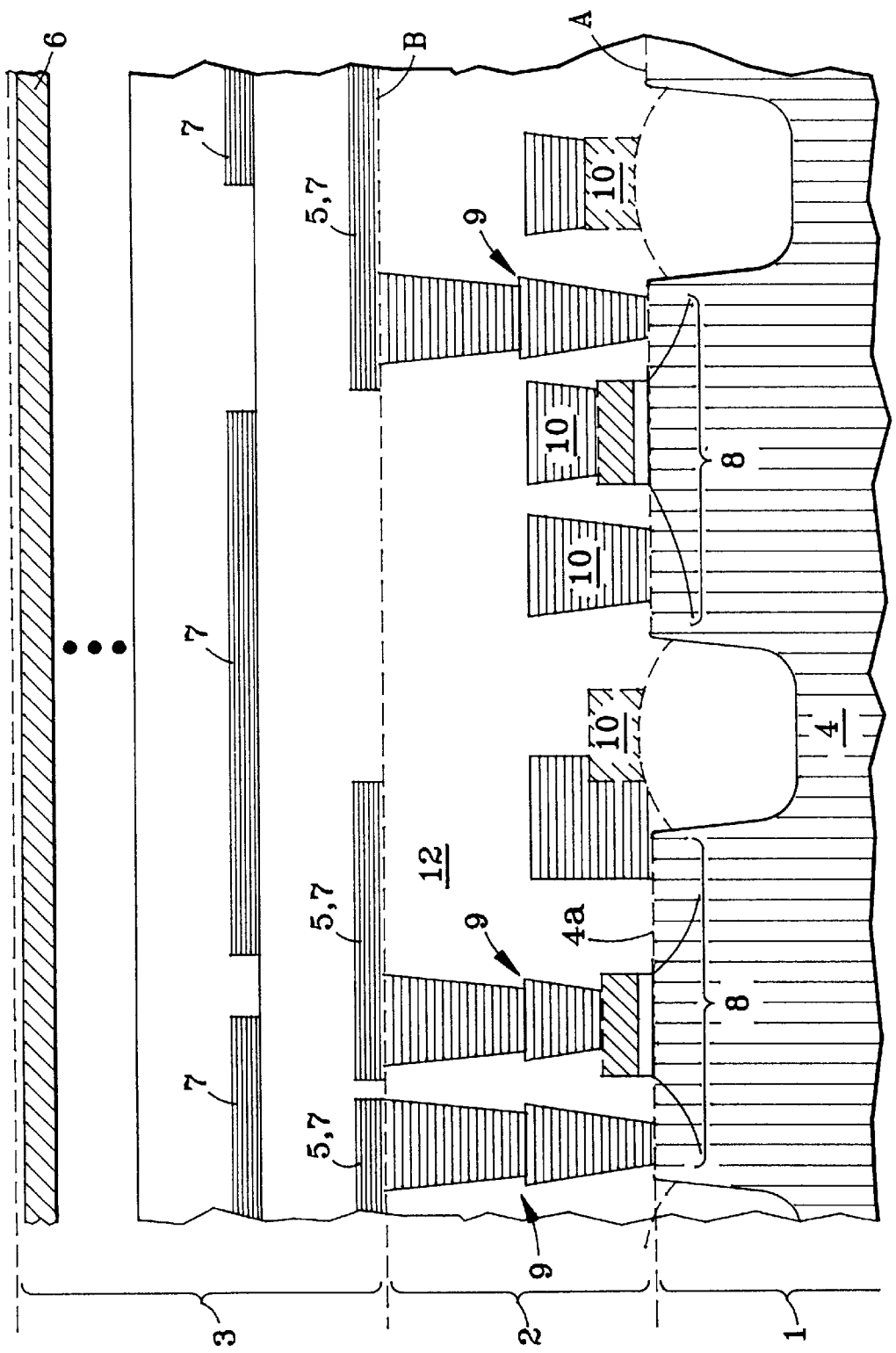
FIG. 1 is a schematic diagram of a conventional semiconductor structure including a device structure, a contact structure and a wiring structure.
Figure 2:
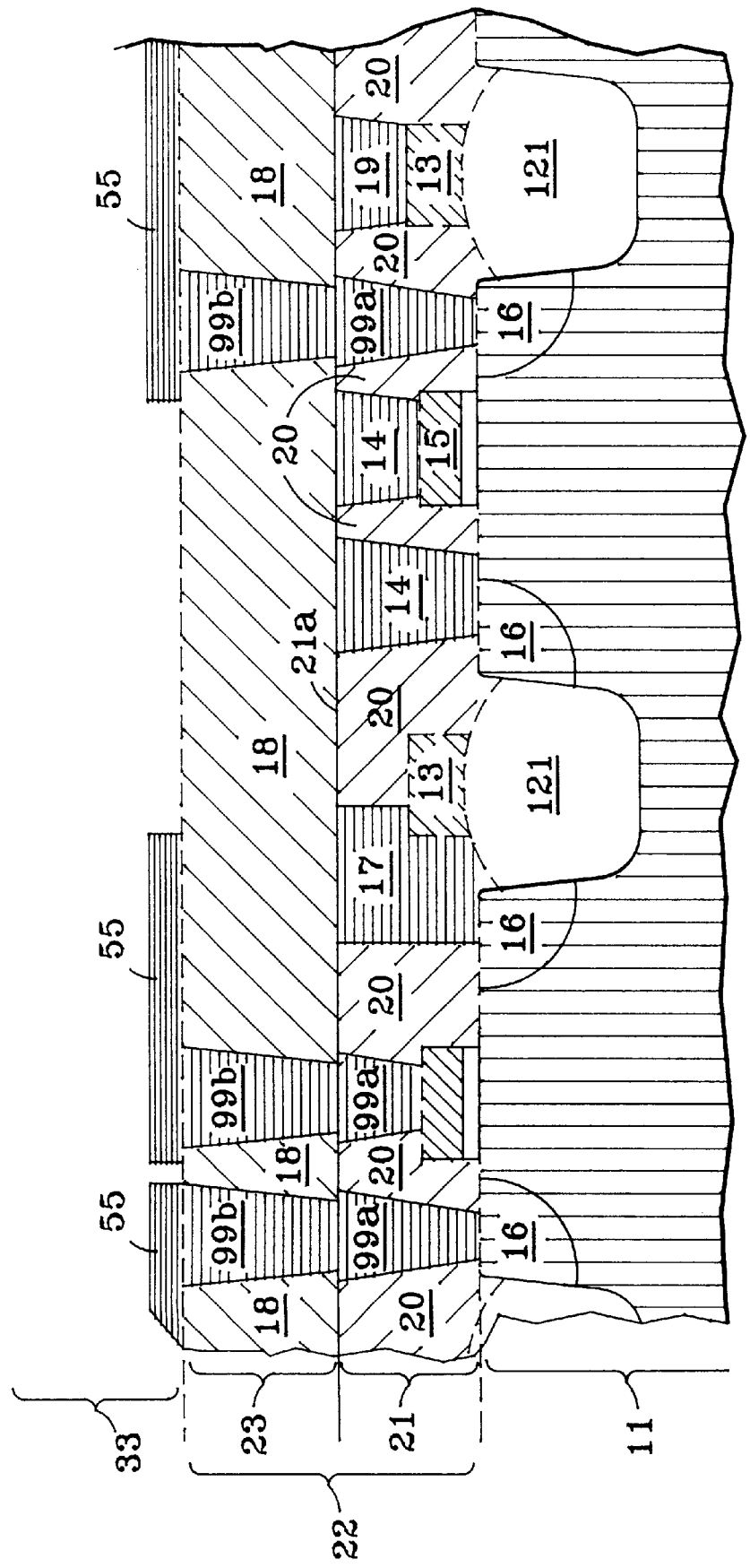
FIG. 2 is a schematic diagram of a conventional semiconductor structure including a device structure, a contact structure and a portion of a wiring structure, which shows details of the contact structure.
Figure 3A:
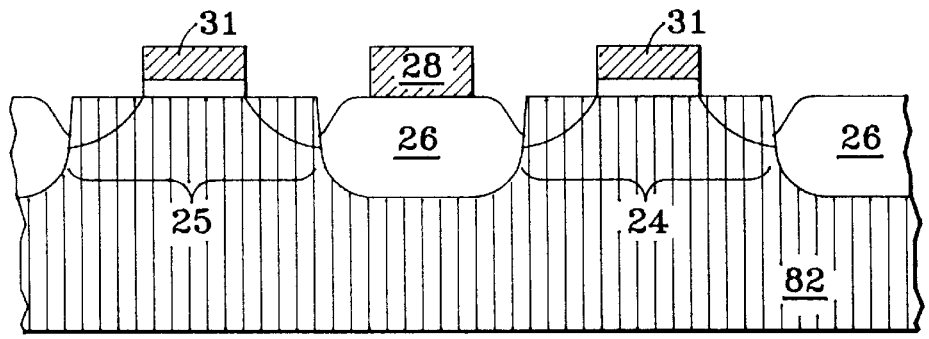
FIGS. 3A–3F are schematic diagrams showing a semiconductor structure similar to that shown in FIGS. 1 and 2 at various stages of completion of a conventional fabrication process.
Figure 3B:
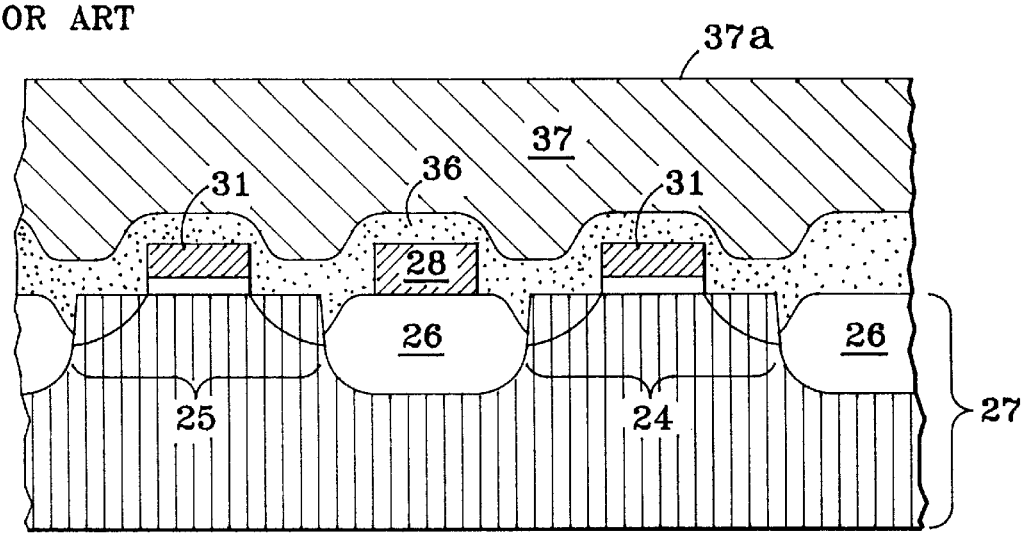
Figure 3C:
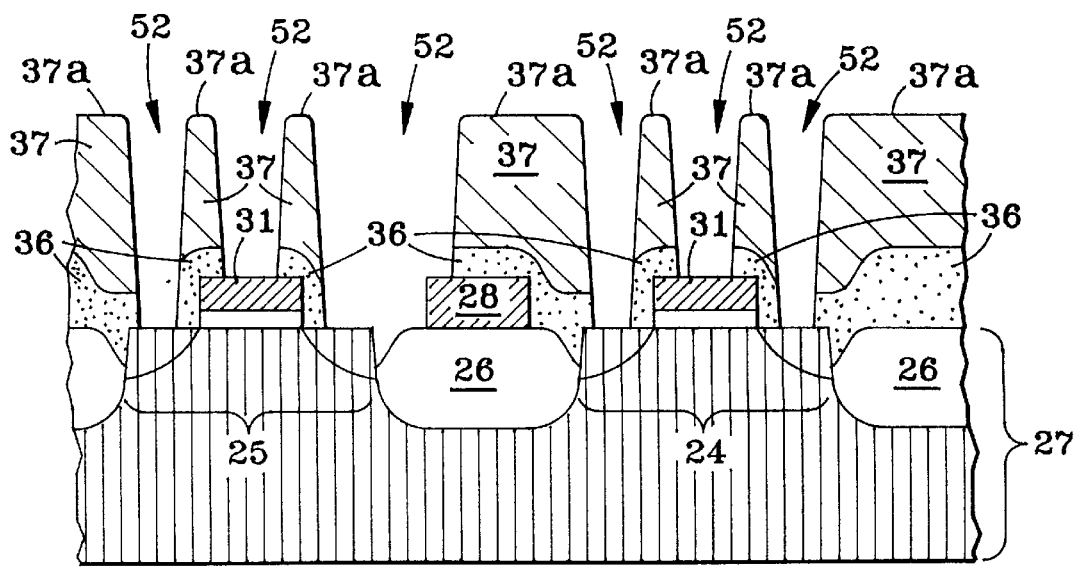
Figure 3D:
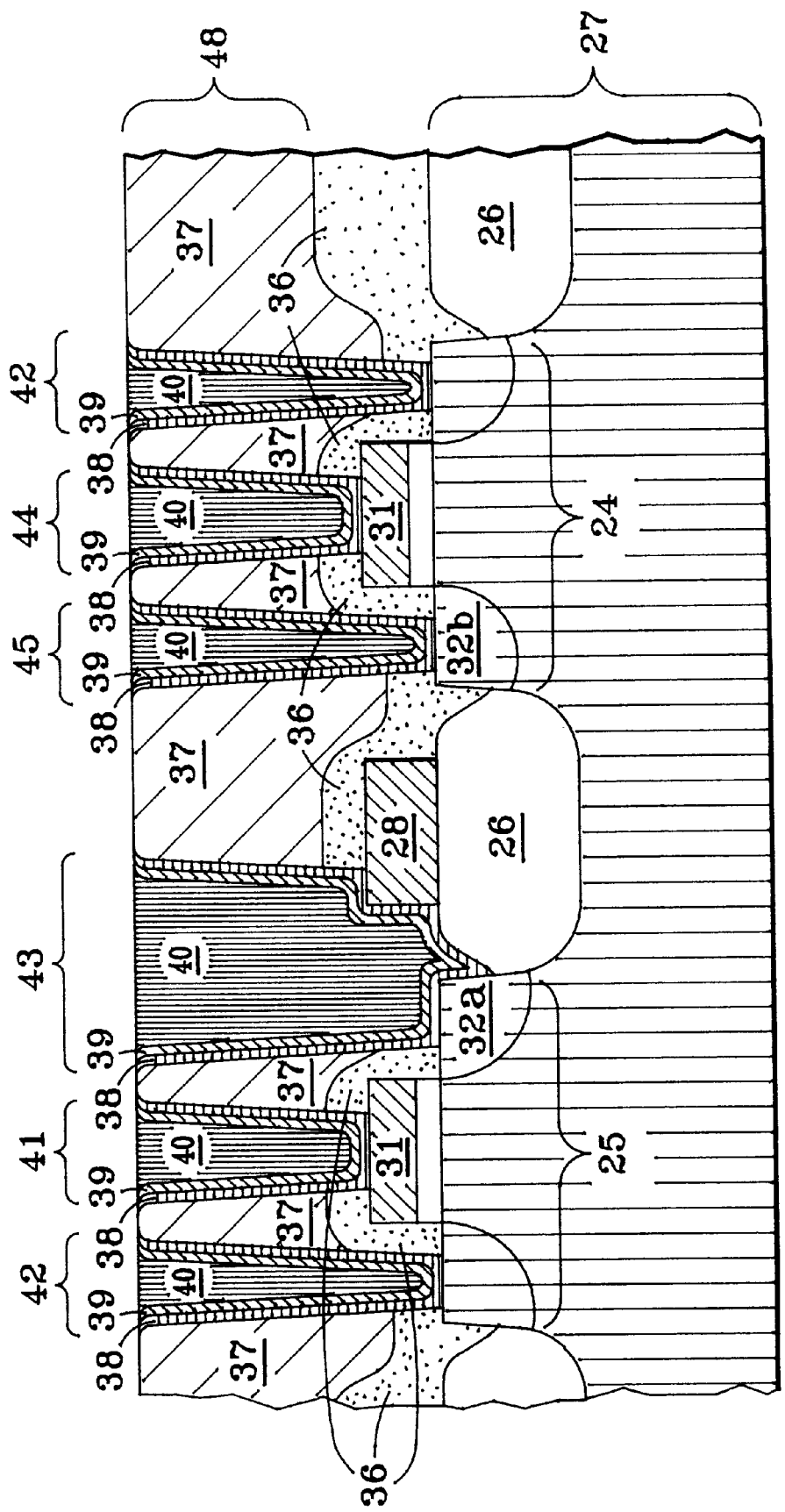
Figure 3E:
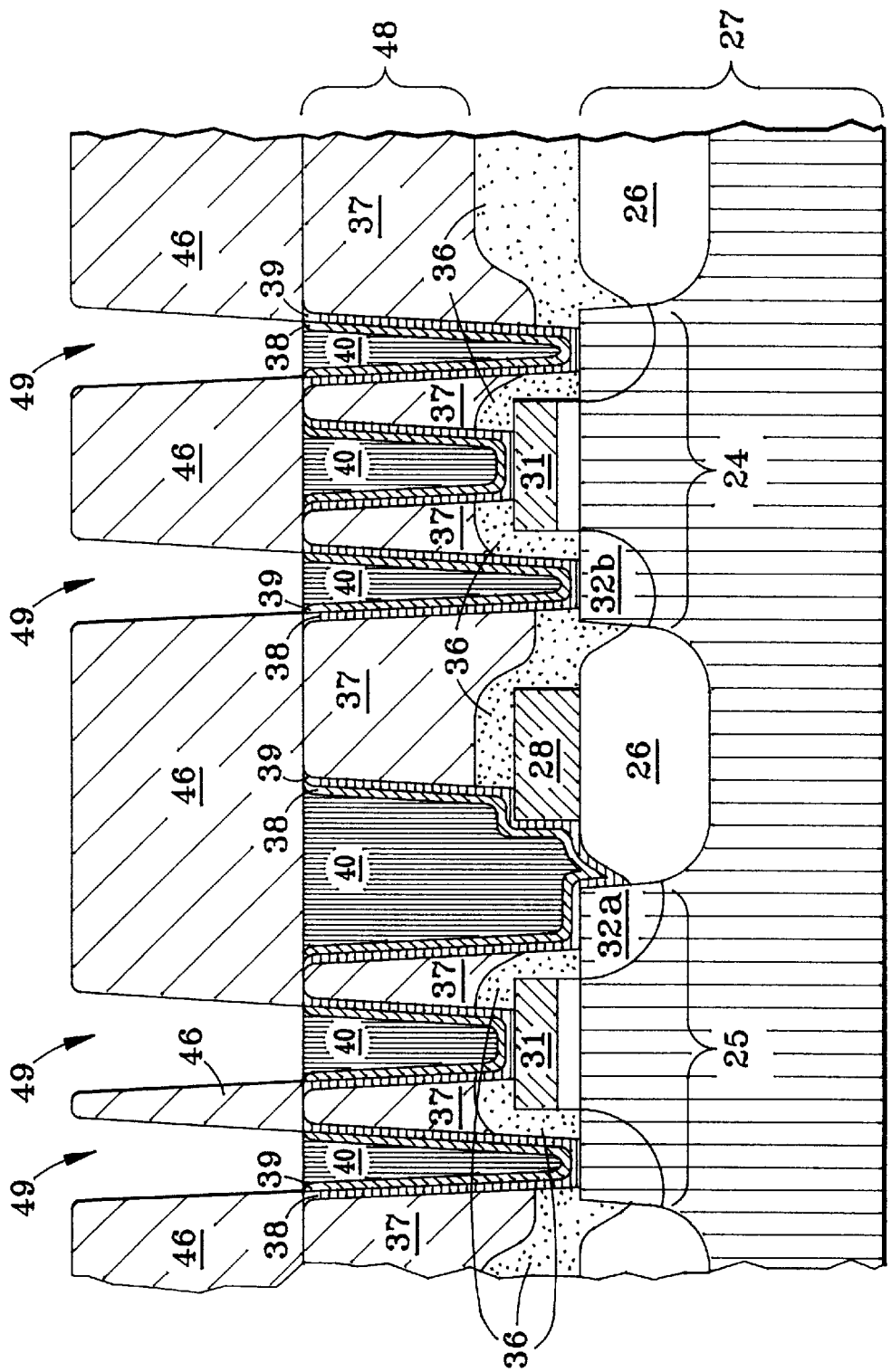
Figure 3F:
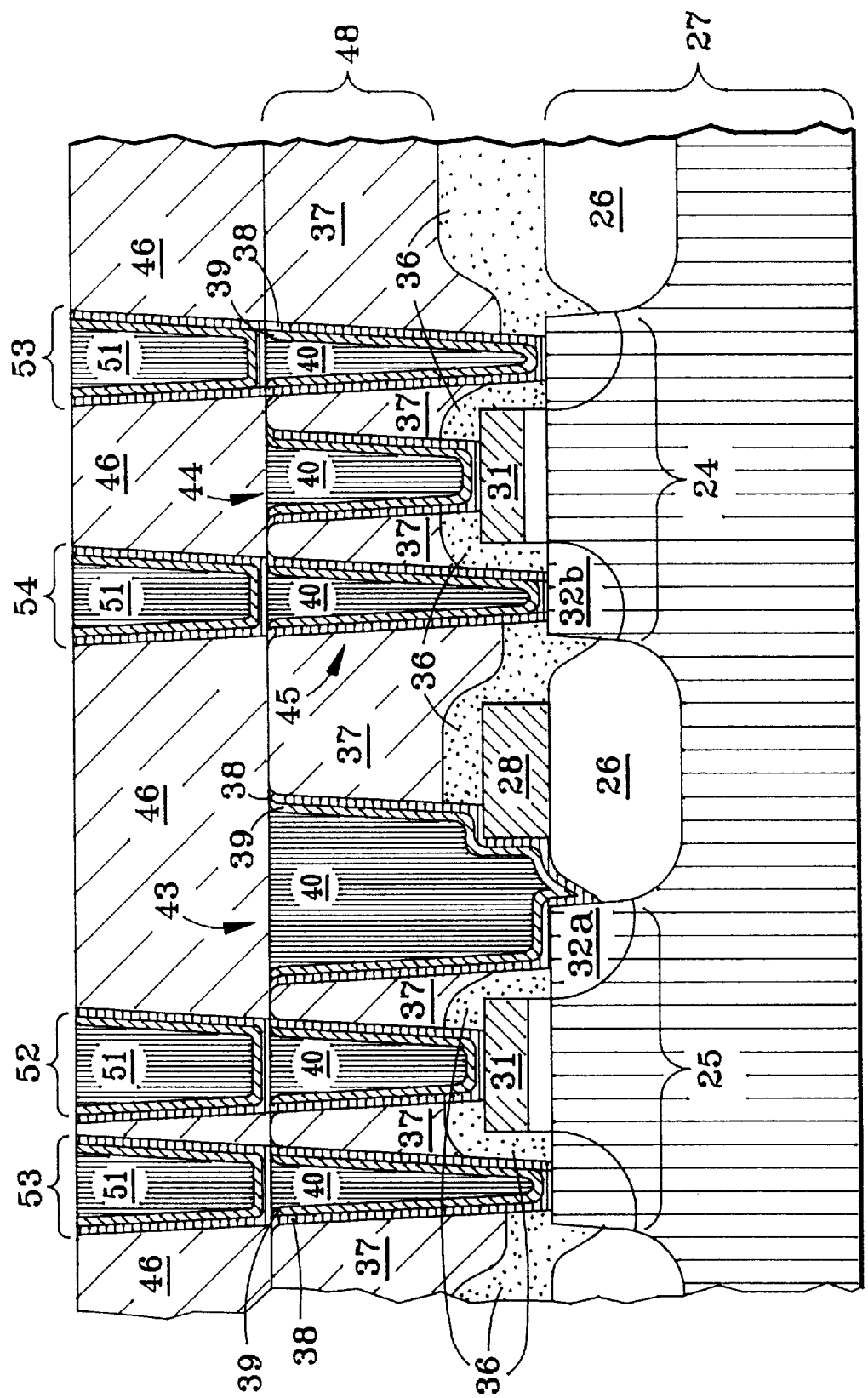
Figure 4A:
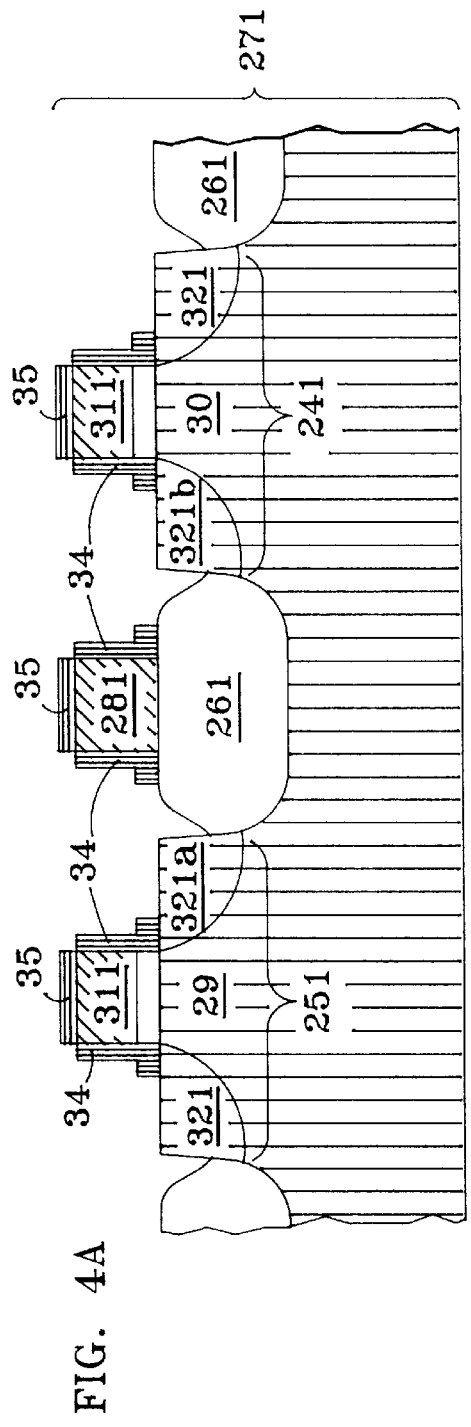
FIGS. 4A–4F are schematic diagrams showing a semiconductor structure at various stages of completion of a preferred embodiment of the method of the present invention.

FIG. 4A shows an exemplary completed device structure 271 that includes: completed transistors 241 and 251, completed field isolation regions 261 and a completed LI line 281. The exemplary device structures shown in FIG. 4A can be formed by known methods. Passive elements, such as resistors and capacitors are not shown but it should be understood that such may be formed within the completed device structure 271. It is also understood that the process is not limited to the device structure 271 described herein and is applicable to many other forms of device structures.

The gates 311 of both transistor 251 and transistor 241 are preferably polysilicon. Transistors 241 and 251 include doped diffusion regions 321 (including diffusion regions 321a and 321b) on both sides of the gates 311. The gates 311 of both transistors 241 and 251 and the LI line 281 are also preferably flanked by nitride or oxide spacers 34 and may have a layer of titanium silicide 35 formed upon them.

For purposes of illustration, the field isolation region 261 is shown as a shallow trench structure, but the invention is not limited to integration schemes utilizing a shallow trench. In light of the disclosure herein, a person of ordinary skill in the art would understand that the method herein described is applicable to other isolation schemes (for example, LOCOS).

Figure 4B:
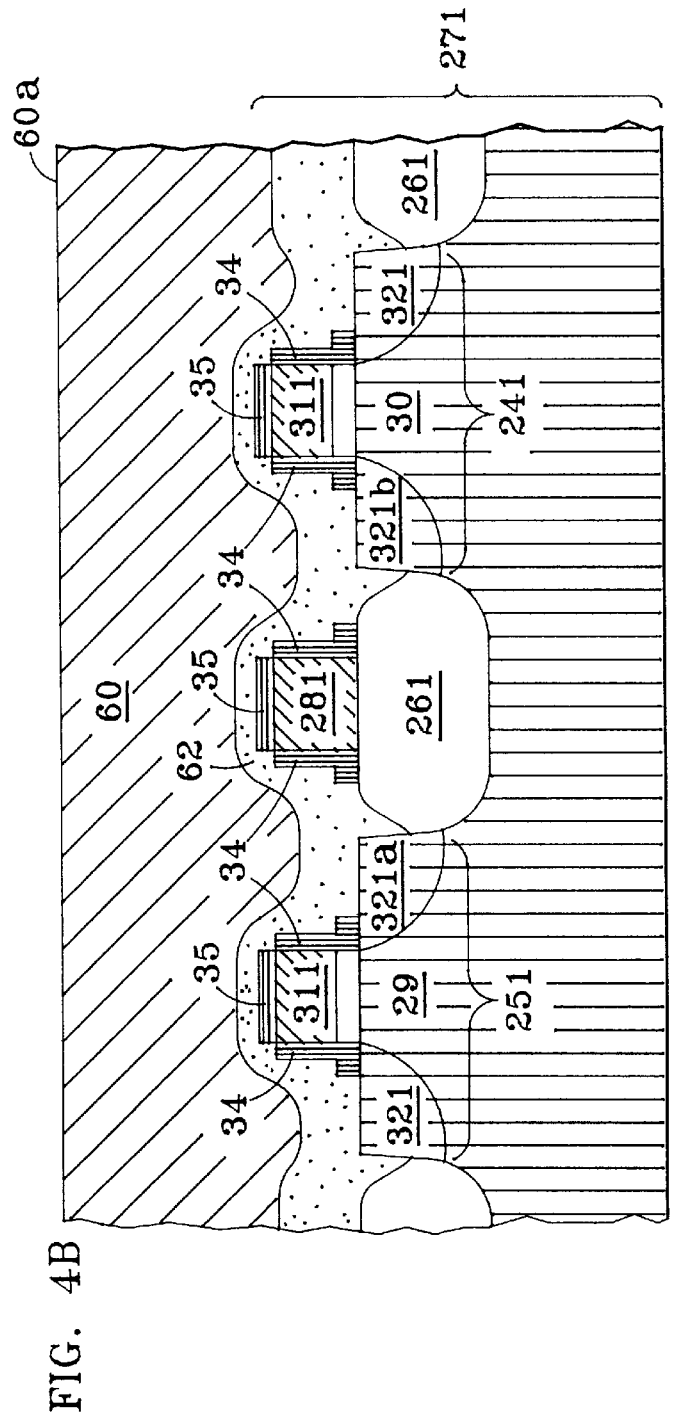

FIG. 4B shows the structure formed by the initial steps of a preferred embodiment of the method of the present invention of forming a contact structure. First, an etch stop layer 62, for example a layer of silicon nitride preferably 50 nm thick, is formed over the surface of the device structure. Next, an insulating layer 60, for example, PSG, preferably 6% PSG 1050 nm thick, is formed over the etch stop layer 62. A portion of the insulating layer 60 can be removed (e.g. on the order or 400 nm removed) by any known method, such as etching or polishing. The result is a multilayer structure including etch stop layer 62 and insulating layer 60.

Figure 4C:
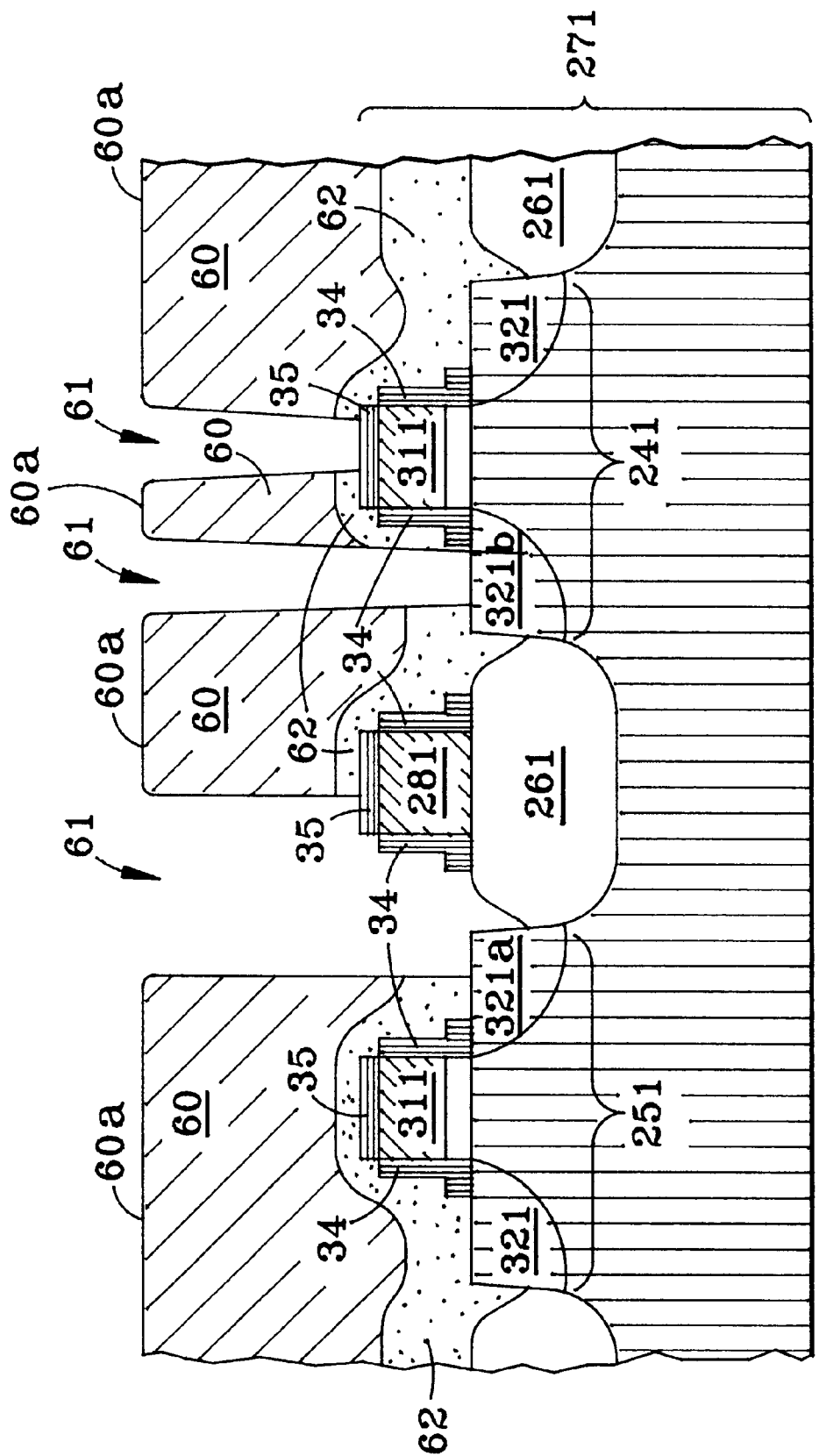

FIG. 4C shows the structure formed after a first level mask exposure and subsequent etch. According to the method of the present invention and unlike the prior art, only features of similar sizes are included on the first level mask. More particularly, for example, no stud features are located on the first level mask; that is, only optical signals that represent bars are exposed at the first level. Thus, the aforementioned exposure dilemma is avoided and the bar features are properly exposed. Once the structure of FIG. 4B is formed, a layer of photosensitive material (e.g., photoresist) is formed over the surface 60a of the insulating layer 60. Then, optical patterns representing features of a relatively large size (e.g. only bar structures and not stud structures), formed by light passing through the transparent patterns of the first level mask, are projected upon the photosensitive layer (not shown). The photosensitive layer can then be exposed and developed conventionally such that regions of insulating layer 60 are exposed where LI bars and bar-like structures are desired. The exposed regions of insulating layer 60 are then removed by an anisotropic etch, preferably a reactive ion etch (RIE), such that openings 61 are introduced into the insulating layer 60. Next, the photosensitive material is removed, and the exposed etch stop layer 62 is selectively removed, preferably by RIE, such that the field isolation region 261, diffusion regions 321 and silicide 35 are not disturbed. Finally, the resulting structure is optionally annealed, preferably at approximately 600° C. for 30 minutes. While such an annealing step could be omitted, or performed earlier, it is thought to be advantageous to perform an anneal after the nitride layer 62 has been deposited.

Figure 4D:
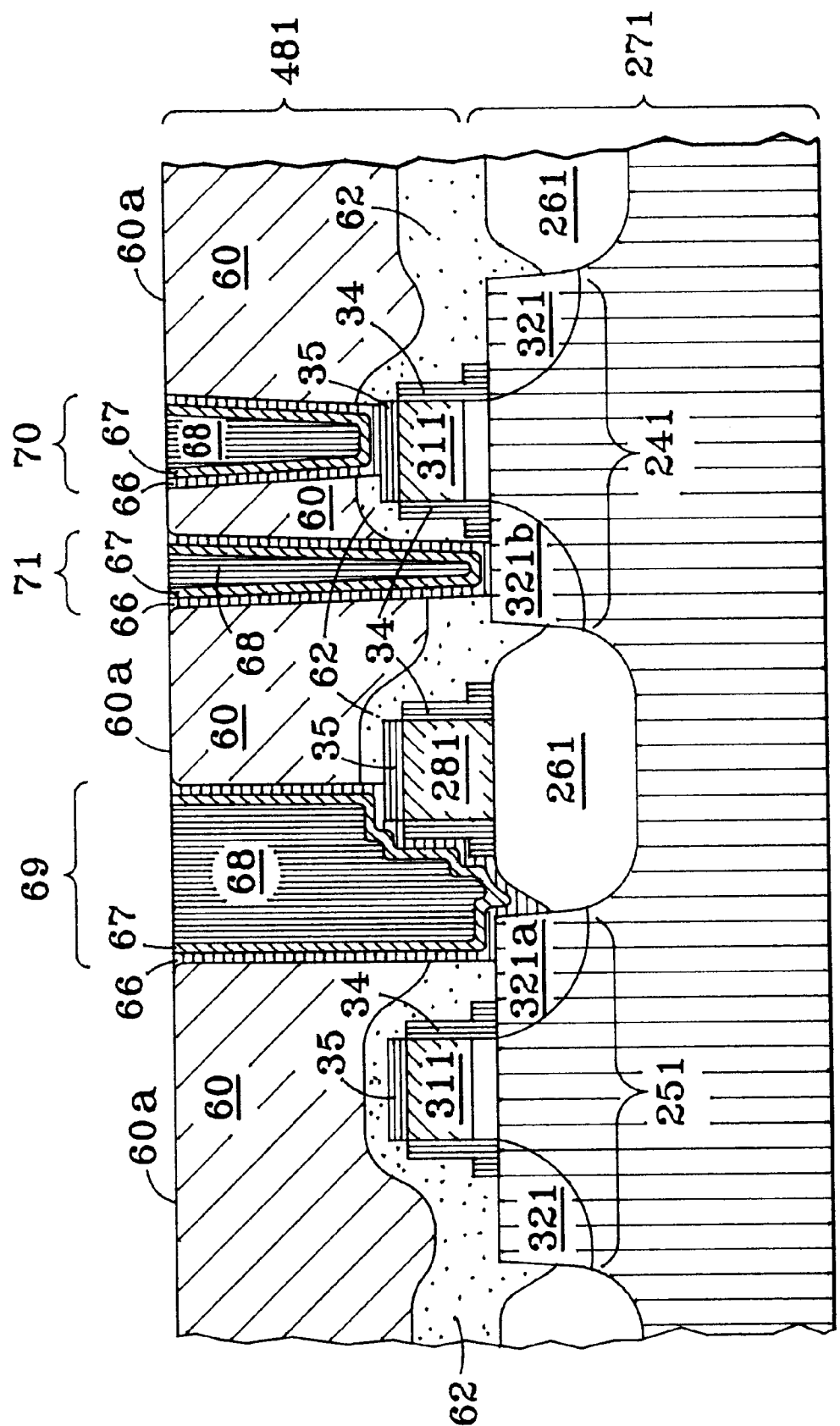

FIG. 4D shows the completed first level 481 of the present invention. Unlike the prior art, only LI bar and bar-like features are present in the completed first level. After the structure of FIG. 4C has been formed, the openings 61 are conformally coated first by a relatively thin layer 66 of material that promotes adhesion, preferably a layer of titanium that is approximately 10 nm thick, then by a diffusion barrier layer 67, preferably a layer of titanium nitride that is approximately 100 nm thick. The resulting structure is preferably annealed together so as to reduce contact resistance. Suitable annealing conditions, for example are a heating temperature of approximately 550° C. for a duration of approximately 30 minutes. Finally, a conductive material 68, preferably a metal such as tungsten, fills the coated openings 61. The conductive material 68 is then polished until the top surface 60a of the insulating layer 60 is reached.

FIG. 4D shows a bar-like structure 69 formed to create an electrical connection between the LI line 281 and the diffusion region 321a of transistor 251, an LI bar 70 placed upon a gate electrode 311 and an LI bar 71 located upon a diffusion region 321b. It is understood that other bar-like structures are possible (e.g. a bar-like structure that bridges across the field oxide to connect adjacent diffusion regions).

Figure 4E:
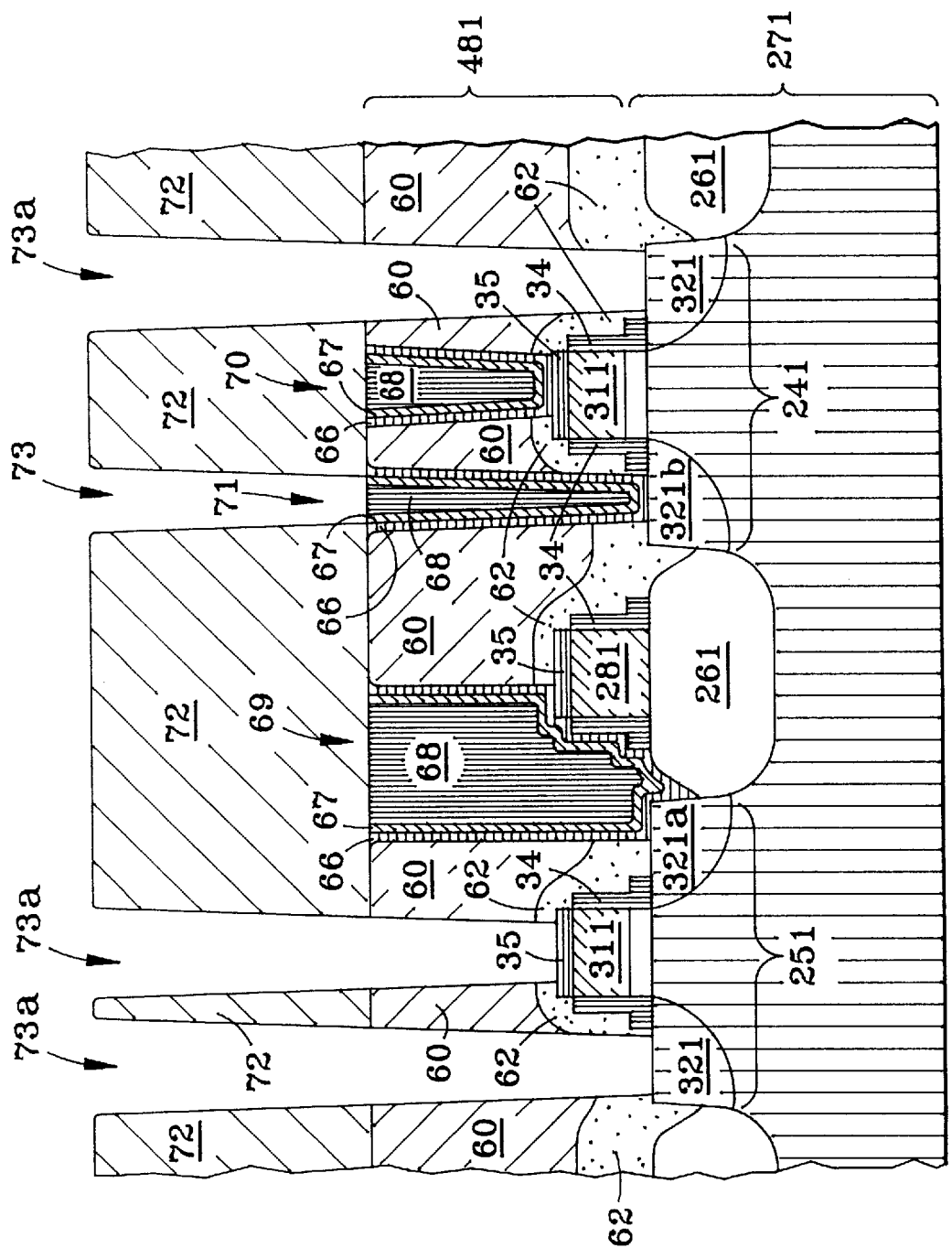

FIG. 4E shows the contact structure after the second level insulation 72 has been formed, patterned and etched on the finished first level 481. A second insulating layer 72, preferably of PSG approximately 600 nm thick, is formed over the finished first level 481. A layer of photosensitive material (not shown) is formed over the insulating layer 72. Then, optical patterns produced by the second level mask and representing relatively small features (e.g. stud contacts to the wiring structure), are focused on the photosensitive material. The photosensitive layer can then be exposed and developed conventionally such that regions of the insulating layer 72 beneath which are desired areas of connection to LI bars 71, LI lines (not shown), gate electrodes 75 or diffusion regions 76 are exposed.

With continued reference to FIG. 4E, the exposed regions of both insulating layers 72 and 60 are removed, thus forming openings 73. It is pointed out that openings 73a, representing relatively small features (e.g. studs) extend through both insulating layers 72 and 60 to provide a means to make contact to transistors 251 and 241. Forming openings 73a requires a high aspect ratio removal technique. For example, one preferred etching method which permits deep openings to be formed is high density plasma etching because of the fast etch rates. More particularly, suitable etch conditions may be approximately as follows in TABLE 1.

| ETCH CONDITION | PREFERRED RANGE | MORE PREFERRED OPERATING POINT |
| --- | --- | --- |
| Etchant Flow (e.g. $C_2F_6$) | 22–28 sccm | 25 sccm |
| Inert Gas Flow (e.g. Helium) | 90–110 sccm | 100 sccm |
| Inductive Power | 1260–1540 W | 1400 W |
| Bias Power | 1260–1540 W | 1400 W |
| Chamber Pressure | 7–9 mT | 8 mT |
| Top Temperature | 215–265 C. | 240° C. |
| Wall Temperature | 180–220 C. | 200° C. |

It should be noted that slower etches could work, but would require more processing time, thus increasing processing costs. The etching of insulating regions 72 and 60 continues until the etch stop layer 62 on the device structure is reached. Finally, the etch stop layer 62 is removed.

Figure 4F:
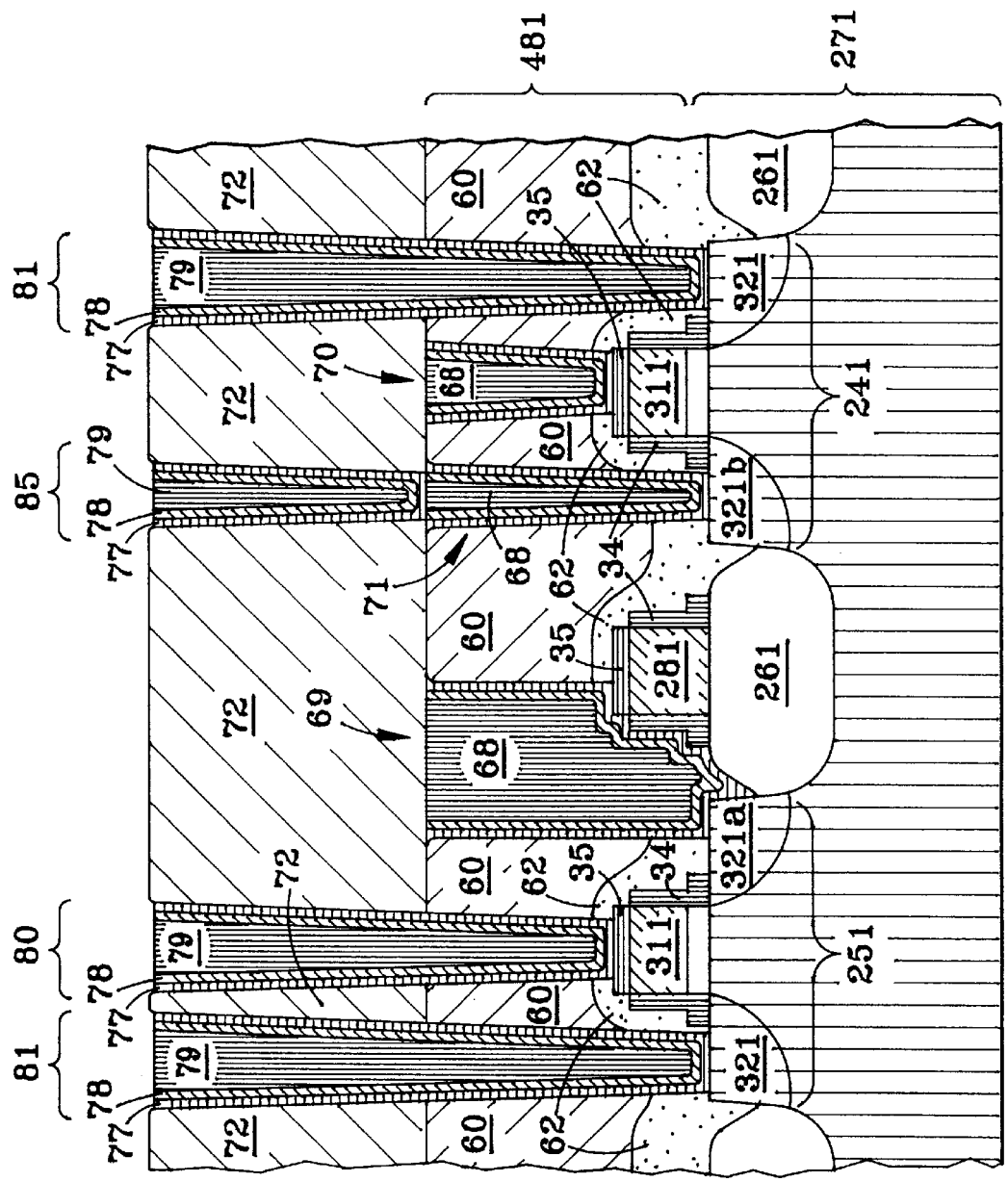

FIG. 4F shows the completed contact and device structures after the openings 73 are coated and filled again, similarly to the coating/filling description referring to FIG. 4D. Thus the contact structure, in this example, is composed of: 1) a wiring-metal-to-gate-metal stud 80, 2) two wiring-metal-to-diffusion-region studs 81, 3) a bar-like structure 69 that forms an electrical connection between a diffusion region 321a and an LI line 281, 4) an LI bar 70 that runs along a gate electrode 311 and 5) an LI bar 71 that runs along a diffusion region 321 that can also be connected to a wiring metal through LI bar stud 85.

While the invention has been particularly shown and described with reference to preferred embodiments thereof, it will be understood by those skilled in the art that various other changes in form and detail may be made therein without departing from the spirit and scope of the invention.

What is claimed is:

1. A method of forming a semiconductor structure having features of differing sizes, the method comprising the steps:

forming a first layer of a dielectric material on a semiconductor substrate;

patterning only a first plurality of features of a first feature size on the first layer;

removing portions of the first layer, the portions corresponding to the first plurality of features, thus forming in the first layer a first plurality of openings corresponding to the first plurality of patterned features;

filling the first plurality of openings with a conductive material;

forming a second layer of a dielectric material, the second layer overlying the first layer and the filled openings;

patterning a second plurality of features of a second feature size on the second layer, the second feature size being smaller than the first feature size;

removing portions of the first layer and the second layer, the portions corresponding to the second plurality of features, thus forming in the second layer and in the first layer a second plurality of openings corresponding to the second plurality of patterned features, the second plurality of openings extending through the first and second layers;

filling the second plurality of openings with a conductive material.

2. The method as recited in claim 1 wherein the first and second dielectric materials are the same.

3. The method as recited in claim 2 wherein the first and second layers are formed by chemical vapor deposition.

4. The method as recited in claim 1 wherein the first layer is formed by chemical vapor deposition.

5. The method as recited in claim 1 wherein the first plurality of features represents bars.

6. The method as recited in claim 1 wherein the second plurality of small features represents studs.

7. The method as recited in claim 1 wherein the step of removing portions of the first layer comprises etching.

8. The method as recited in claim 7 wherein the step of removing portions of the first layer comprises reactive ion etching.

9. The method as recited in claim 1 wherein the step of removing portions of the second layer comprises etching.

10. The method as recited in claim 9 wherein the step of removing portions of the second layer comprises reactive ion etching.

11. The method as recited in claim 1 wherein the conductive material comprises tungsten.

\* \* \* \* \*